(12) United States Patent
Bai et al.

(10) Patent No.: US 8,962,404 B2
(45) Date of Patent: Feb. 24, 2015

(54) METHOD FOR MANUFACTURING FAN-OUT LINES ON ARRAY SUBSTRATE

(71) Applicants: Boe Technology Group Co., Ltd., Beijing (CN); Beijing Boe Display Technology Co., Ltd., Beijing (CN)

(72) Inventors: Jinchao Bai, Beijing (CN); Liang Sun, Beijing (CN); Xiangqian Ding, Beijing (CN); Liangliang Li, Beijing (CN); Yao Liu, Beijing (CN)

(73) Assignees: Boe Technology Group Co., Ltd., Beijing (CN); Beijing Boe Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/077,770

(22) Filed: Nov. 12, 2013

(65) Prior Publication Data

US 2014/0134809 A1 May 15, 2014

(30) Foreign Application Priority Data

Nov. 13, 2012 (CN) .......................... 2012 1 0454642

(51) Int. Cl.
*H01L 21/00* (2006.01)
*H01L 27/12* (2006.01)

(52) U.S. Cl.
CPC .......... *H01L 27/1288* (2013.01); *H01L 27/127* (2013.01)
USPC .............................. 438/158; 438/149; 438/151

(58) Field of Classification Search
None
See application file for complete search history.

(56) References Cited

U.S. PATENT DOCUMENTS

| | | | |
|---|---|---|---|
| 2005/0219434 A1* | 10/2005 | Sakurai ........................... | 349/42 |
| 2007/0008442 A1 | 1/2007 | Ishigaki et al. | |
| 2008/0187870 A1* | 8/2008 | Shin et al. ..................... | 430/321 |
| 2008/0206911 A1* | 8/2008 | Park et al. ........................ | 438/30 |
| 2009/0045402 A1* | 2/2009 | Kuo ................................ | 257/59 |
| 2010/0019244 A1* | 1/2010 | Song et al. ..................... | 257/59 |
| 2010/0200856 A1* | 8/2010 | Hu et al. ......................... | 257/59 |
| 2011/0065277 A1* | 3/2011 | Asou .............................. | 438/694 |
| 2012/0276697 A1* | 11/2012 | Cao et al. ....................... | 438/158 |

FOREIGN PATENT DOCUMENTS

KR 20010084255 A 9/2001

OTHER PUBLICATIONS

First Chinese Office Action Appln. No. 201210454642.X; Dated Oct. 23, 2014.

* cited by examiner

*Primary Examiner* — Charles Garber
*Assistant Examiner* — Evren Seven
(74) *Attorney, Agent, or Firm* — Ladas & Parry LLP

(57) ABSTRACT

A method for manufacturing fan-out lines on an array substrate is disclosed. The fan-out lines comprise an amorphous silicon layer, an ohmic contact layer and a source-drain electrode layer disposed on a gate insulating layer. The manufacturing processes can be conducted by forming a first layer of photoresist on the source-drain electrode layer and performing a half-exposure development process on the first layer of photoresist; etching the amorphous silicon layer, the ohmic contact layer and the source-drain electrode layer by an etching process; removing the first layer of photoresist; forming a second layer of photoresist and performing full-exposure development process on the second layer of photoresist; and etching the amorphous silicon layer by etching process to form the fan-out lines.

5 Claims, 5 Drawing Sheets

METHOD FOR MANUFACTURING FAN-OUT LINES ON ARRAY SUBSTRATE

TECHNICAL FIELD

The embodiments of the present technical disclosure relate to a method for manufacturing fan-out lines on an array substrate.

BACKGROUND

Thin-film transistor liquid crystal displays (TFT-LCDs) have become mainstream displays applied to products such as mobile phones and tablet PCs. Moreover, along with users' more and more common requirements on high color quality, high contrast, broad viewing angle, high response speed and low power consumption, organic light-emitting diode (OLED) displays also begin to enter users' field of vision.

Currently, there is a trend for a display device to have a narrow frame. The narrow-frame technology requires the area of a fan-out area of an array substrate to be as small as possible, namely requires the distance between fan-out lines to be as small as possible. A fan-out area is provided on the periphery of the panel of a display device. However, the minimum distance between two adjacent fan-out lines manufactured in a conventional technology is approximately between 7 and 10 micrometers (mm) and cannot meet the technical requirement of a narrow frame.

SUMMARY

The embodiments of the present technical disclosure provide a method for manufacturing fan-out lines on an array substrate, which can reduce the distance between two adjacent fan-out lines of the array substrate and allows the preparation of an array substrate capable of meeting the technical requirement of a narrow frame.

According to one embodiment of the present technical disclosure, an array substrate is provided. The array substrate comprises a base substrate, a gate insulating layer and a fan-out wiring, wherein the gate insulating layer is disposed on the base substrate; the fan-out wiring is disposed on the gate insulating layer and includes a plurality of fan-out lines; and the fan-out lines include an amorphous silicon layer, an ohmic contact layer and a source-drain electrode layer which are disposed on the gate insulating layer. The fan-out lines are formed by the following processes: forming a first layer of photoresist on the source-drain electrode layer and performing a half-exposure development process on the first layer of photoresist; etching the amorphous silicon layer, the ohmic contact layer and the source-drain electrode layer; removing the first layer of photoresist; and forming a second layer of photoresist and performing a full-exposure development process on the second layer of photoresist; and etching the amorphous silicon layer.

According to another embodiment of the present technical disclosure, a display device is provided. The display device comprises a color filter substrate and the above-mentioned array substrate, which are arranged opposite to each other, and liquid crystals filled between the color filter substrate and the array substrate.

According to still another embodiment of the present technical disclosure, a display device is provided. The display device comprises the above-mentioned array substrate and organic light-emitting materials formed on the array substrate.

According to further still another embodiment of the present technical disclosure, a method for manufacturing fan-out lines on an array substrate is provided. The manufacturing method comprises: forming a gate insulating layer, an amorphous silicon layer, an ohmic contact layer and a source-drain electrode layer in a fan-out area of a base substrate in sequence; forming a first layer of photoresist on the source-drain electrode layer; performing a half-exposure process on the first layer of photoresist, and forming a photoresist pattern including a photoresist-completely-retained region, a photoresist-partially-retained region, and a photoresist-completely-removed region after development, in which the photoresist-completely-retained region corresponds to the fan-out lines, and the photoresist-partially-retained region corresponds to an interval region between two adjacent fan-out lines; performing a combination of etching process and ashing process by: etching the source-drain electrode layer, the ohmic contact layer and the amorphous silicon layer corresponding to the photoresist-completely-removed region, removing the first layer of photoresist in the photoresist-partially-retained region by ashing, retaining a part of amorphous silicon layer in the photoresist-partially-retained region, removing the first layer of photoresist in the photoresist-completely-retained region, and forming a second layer of photoresist on the gate insulating layer, the patterned source-drain electrode layer and the amorphous silicon layer; performing a full-exposure process on the second layer of photoresist, and forming a second photoresist pattern including a second photoresist retained regions and a second photoresist non-retained region after development, in which the second layer of photoresist retained regions correspond to fan-out lines to be formed; and etching the amorphous silicon layer corresponding to the photoresist non-retained region, so as to form a plurality of fan-out lines.

Further scope of applicability of the present technical disclosure will become apparent from the detailed description given hereinafter. However, it should be understood that the detailed description and specific examples, while indicating preferred embodiments of the technical disclosure, are given by way of illustration only, since various changes and modifications within the spirit and scope of the technical disclosure will become apparent to those skilled in the art from the following detailed description.

BRIEF DESCRIPTION OF THE DRAWINGS

The present technical disclosure will become more fully understood from the detailed description given hereinafter and the accompanying drawings which are given by way of illustration only, and thus are not limitative of the present technical disclosure and wherein.

DETAILED DESCRIPTION

For more clear understanding of the objectives, technical proposals and advantages of the embodiments of the present technical disclosure, clear and complete description will be given below to the technical proposals of the embodiments of the present technical disclosure with reference to the accompanying drawings of the embodiments of the present technical disclosure. It will be obvious to those skilled in the art that the preferred embodiments are only partial embodiments of the present technical disclosure but not all the embodiments. All the other embodiments obtained by those skilled in the art without creative efforts on the basis of the embodiments of the present technical disclosure illustrated shall fall within the scope of protection of the present technical disclosure.

Unless otherwise specified, the technical terms or scientific terms used herein have normal meanings understood by those skilled in the art. The words "first", "second" and the like used in the disclosure do not indicate the sequence, the number or the importance but are only used for distinguishing different components. Similarly, the words "a", "an", "the" and the like also do not indicate the number but only indicate at least one. The word "comprising", "including" or the like indicates that the element or the component before the word contain the elements or the components listed after the word. The words "connection", "connected" and the like are not limited to physical or mechanical connection but may include electrical connection, either directly or indirectly. The words "on", "under", "left", "right" and the like only indicate the relative position relationship which is correspondingly changed when the absolute position of a described object is changed.

Figure 1A:
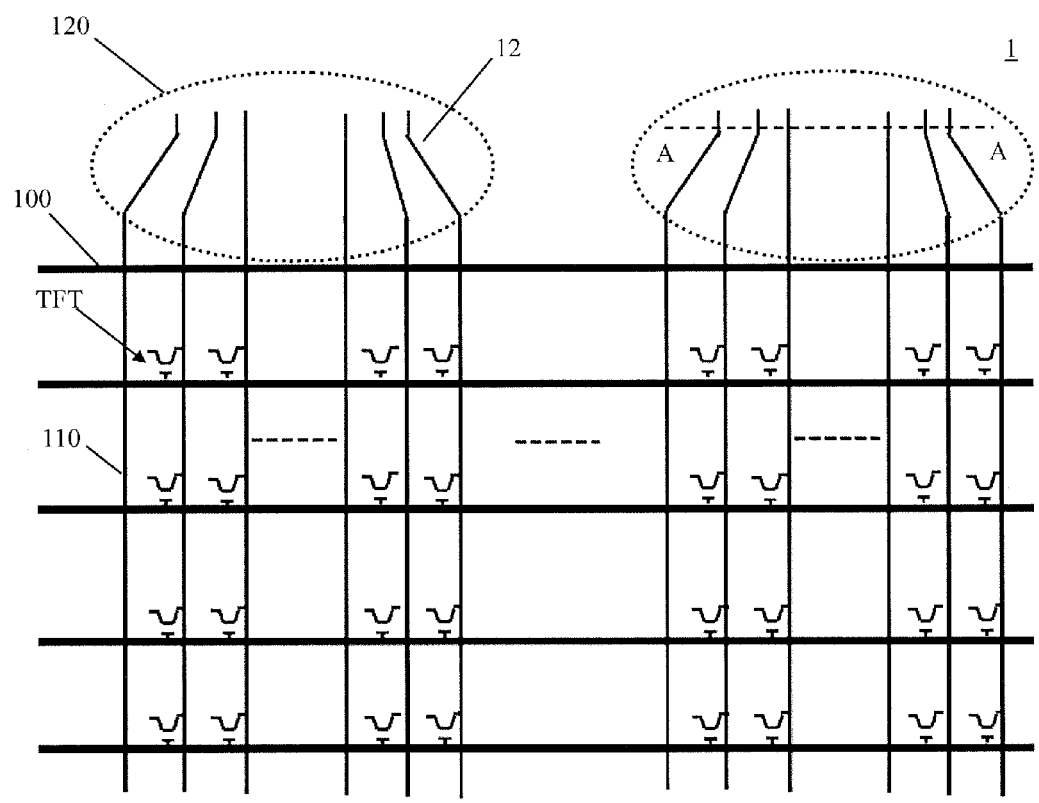
FIG. 1A is a plan view of an array substrate provided by an embodiment of the present technical disclosure.

According to one embodiment of the present technical disclosure, an array substrate is provided, and as illustrated in FIG. 1A, the array substrate comprises a display area and a peripheral area, wherein the peripheral area includes fan-out areas 120; a plurality of gate lines 100 and a plurality of data lines 110 are, for instance, formed in the display area; the gate lines 100 and the data lines 110 are intersected with each other to define pixel units arranged in a matrix; each pixel unit includes a thin-film transistor (TFT) taken as a switching element and a pixel electrode (not illustrated) for controlling the orientation of liquid crystals; and the fan-out area 120 includes fan-out lines 12 which are connected with corresponding gate lines 100 or data lines 110 in the display area. The fan-out areas and fan-out lines related to the data lines are not illustrated in FIG. 1A.

More specifically, the array substrate comprises a base substrate, a gate insulating layer disposed on the base substrate, and a fan-out wiring disposed on the gate insulating layer. The fan-out wiring includes a plurality of fan-out lines; and each fan-out line includes an amorphous silicon layer, an ohmic contact layer and a source-drain electrode layer, which are disposed on the gate insulating layer in sequence.

Figure 1B:
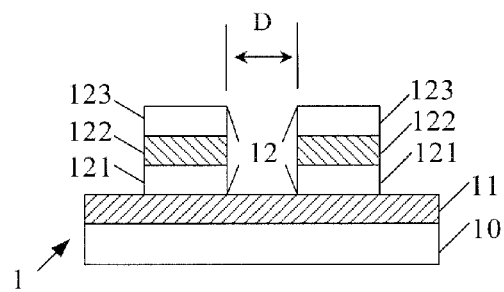
FIG. 1B is a schematic sectional view of fan-out lines of the array substrate along the A-A direction in FIG. 1A.

As illustrated by the sectional view of FIG. 1B, a fan-out area of the array substrate 1, disposed on the outside of the display area, may include a base substrate 10, a gate insulating layer II disposed on the base substrate 10, an amorphous silicon layer 121 disposed on the gate insulating layer 11, an ohmic contact layer 122 disposed on the amorphous silicon layer 121, and a source-drain electrode layer 123 disposed on the ohmic contact layer 122. The amorphous silicon layer 121, the ohmic contact layer 122 and the source-drain electrode layer 123 form the fan-out lines 12 together.

The fan-out lines 12 may be formed by the following processes: forming a first layer of photoresist (not illustrated in FIG. 1) and performing a half-exposure development process on the first layer of photoresist, and then etching the amorphous silicon layer 121, the ohmic contact layer 122 and the source-drain electrode layer 123; removing the first layer of photoresist; forming a second layer of photoresist (not illustrated in FIG. 1) and performing full-exposure development process on the second layer of photoresist, and then etching the amorphous silicon layer 121.

For instance, the distance D between two adjacent fan-out lines 12 is between 3 and 5 micrometers.

For instance, the base substrate 10 is made of alkali-free glass.

Alkali-free glass refers to glass which does not contain or contains almost no alkali metal oxides, and can reduce the shrinkage incurred in the heating process in the premise of not obviously improving the strain capacity. As for the alkali-free glass, the ratio of the gradient $\Delta$an-st (ppm/° C.), of an equilibrium density curve within the temperature range from the temperature in the vicinity of annealing points (Tan) to the temperature in the vicinity of strain points (Tst), to the average coefficient of linear expansion $\alpha 50\text{-}350$ ($\times 10^{-6}/°$ C.) at the temperature of between 50 and 350° C. is greater than or equal to 3.64.

According to another embodiment of the present technical disclosure, a method for manufacturing fan-out lines on an array substrate is provided. The manufacturing method comprises the following processes.

Firstly, a gate insulating layer, an amorphous silicon layer, an ohmic contact layer and a source-drain electrode layer are formed in a fan-out area of a base substrate in sequence; and a first layer of photoresist is formed on the source-drain electrode layer.

One example of the process for forming the first layer of photoresist on the source-drain electrode layer, in the embodiment of the present technical disclosure, is to form the first layer of photoresist on the source-drain electrode layer by deposition, coating or the like. The first layer of photoresist may be positive photoresist or negative photoresist.

A half-exposure process is performed on the first layer of photoresist with, for instance, a half-tone or gray-tone mask, and then there is formed a photoresist pattern including a photoresist-completely-retained region, a photoresist-partially-retained region and a photoresist-completely-removed region after the development of the exposed photoresist, in which the photoresist-completely-retained region corresponds to the fan-out lines; the photoresist-partially-retained region corresponds to an interval region between two adjacent fan-out lines; and the photoresist-completely-removed region corresponds to a region outside of the fan-out lines.

In the present disclosure, only the photoresist-completely-retained region or the photoresist-partially-retained region in the fan-out area of the array substrate is described, and that in the display area of the array substrate is not described. For instance, a conventional technology may be employed to form gate lines, data lines, TFTs and the like in the display area, and therefore the display area will not be further described.

The combination of etching process and ashing process are employed by: firstly etching the source-drain electrode layer, the ohmic contact layer and the amorphous silicon layer corresponding to the photoresist-completely-removed region, and then removing the first layer of photoresist in the photoresist-partially-retained region; and etching and retaining a part of amorphous silicon layer in the photoresist-partially-retained region. For instance, the objective of etching and retaining a part of amorphous silicon layer can be achieved by the control of the etching time or the etching gas volume.

The photoresist in the photoresist-completely-retained region is removed, and a second layer of photoresist is formed on the gate insulating layer, the patterned source-drain electrode layer and the amorphous silicon layer.

One example of the process for forming the second layer of photoresist on the gate insulating layer, the patterned source-drain electrode layer and the amorphous silicon layer, in the embodiment of the present technical disclosure, is to form the second layer of photoresist on the gate insulating layer, the patterned source-drain electrode layer and the amorphous silicon layer by deposition, coating or the like. The second layer of photoresist may be positive photoresist or negative photoresist as well.

A full-exposure process is performed on the second layer of photoresist with a normal single-tone mask, and there is formed a photoresist pattern having a photoresist retained region and a photoresist non-retained region after the development of the exposed photoresist, in which the photoresist retained region corresponds to fan-out lines to be formed. The amorphous silicon layer corresponding to the photoresist non-retained region is etched by the etching process to form the plurality of fan-out lines.

One example of the method for manufacturing the fan-out lines on the array substrate provided by an embodiment of the present technical disclosure, can be conducted as follows:

S101: providing a base substrate. For instance, the base substrate may be made of alkali-free glass.

Figure 2:
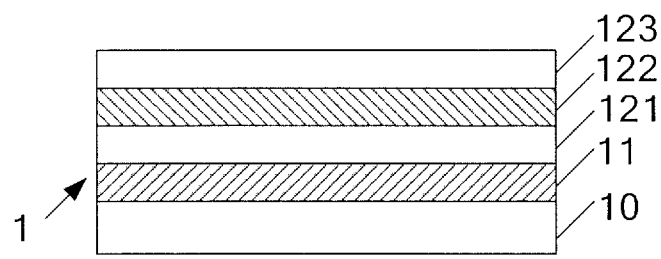
FIG. 2 is a first schematic structural view of fan-out lines of an array substrate in the method for manufacturing fan-out lines on the array substrate provided by an embodiment of the present technical disclosure.

S102: forming a gate insulating layer, an amorphous silicon layer, an ohmic contact layer and a source-drain electrode layer in a fan-out area of the substrate in sequence. As illustrated in FIG. 2, for instance, a gate insulating layer 11, an amorphous silicon layer 121, an ohmic contact layer 122 and a source-drain electrode layer 123 are formed in a fan-out area of a base substrate 10 in sequence, and the base substrate 10 has be cleaned in advance.

Figure 3:
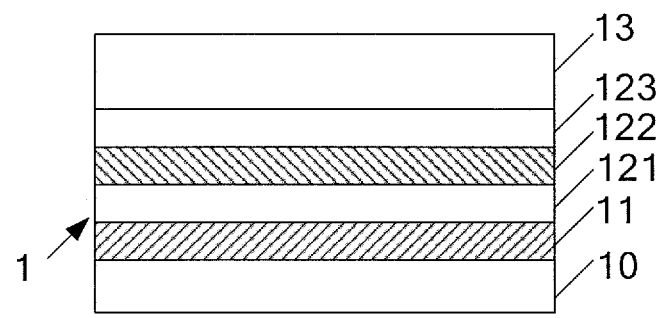
FIG. 3 is a second schematic structural view of fan-out lines of an array substrate in the method for manufacturing fan-out lines on the array substrate provided by an embodiment of the present technical disclosure.

S103: forming a first layer of photoresist on the source-drain electrode layer. As illustrated in FIG. 3, one layer of first photoresist 13 is formed on the source-drain electrode layer 123.

Figure 4:
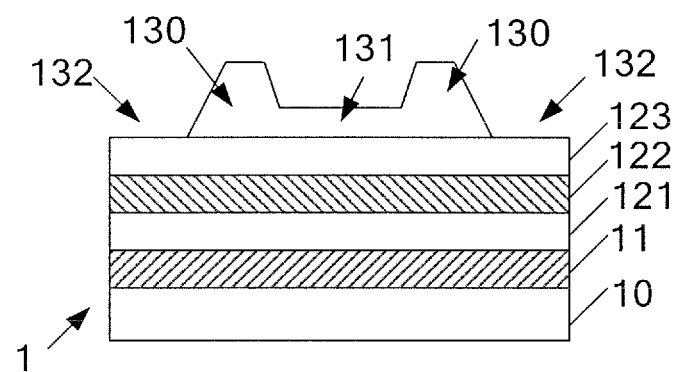
FIG. 4 is a third schematic structural view of fan-out lines of an array substrate in the method for manufacturing fan-out lines on the array substrate provided by an embodiment of the present technical disclosure.

S104: performing a half-exposure process on the first layer of photoresist, and forming a photoresist pattern having a photoresist-completely-retained region, a photoresist-partially-retained region and a photoresist-completely-removed region after development. For instance, as illustrated in FIG. 4, the first layer of photoresist 13 is subjected to one exposure process with a double-tone mask, and a photoresist-completely-retained region 130, a photoresist-partially-retained region 131, and a photoresist-completely-removed region 132 are formed after development.

Figure 5:
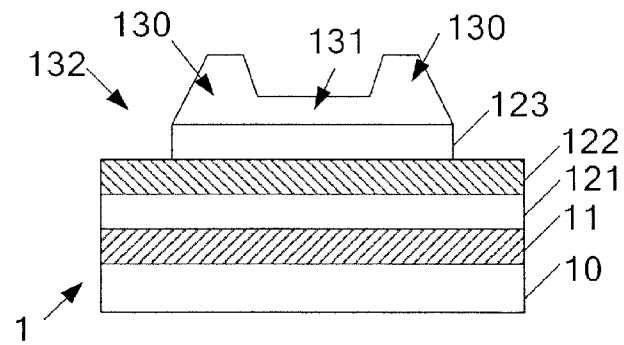
FIG. 5 is a fourth schematic structural view of fan-out lines of an array substrate in the method for manufacturing fan-out lines on the array substrate provided by an embodiment of the present technical disclosure.

S105: employing a wet etching process to etch the source-drain electrode layer corresponding to the photoresist-completely-removed region. For instance, as illustrated in FIG. 5, the source-drain electrode layer 123 corresponding to the photoresist-completely-removed region 132 as illustrated in FIG. 4 is etched to remove a portion of the source-drain electrode layer 123.

Wet etching is a kind of etching process in which an etching object is immersed in an etching liquid (for instance, dilute hydrochloric acid) for etching. Wet etching is a pure chemical etching process, and has excellent selectivity. In general, the wet etching process will stop after an objective film is etched, and other material films under the objective film will not be damaged. As almost all the wet etching processes have an isotropy property, the width of transverse etching is close to the depth of vertical etching no matter the etching process is applied to an oxide layer or to a metal layer.

Figure 6:
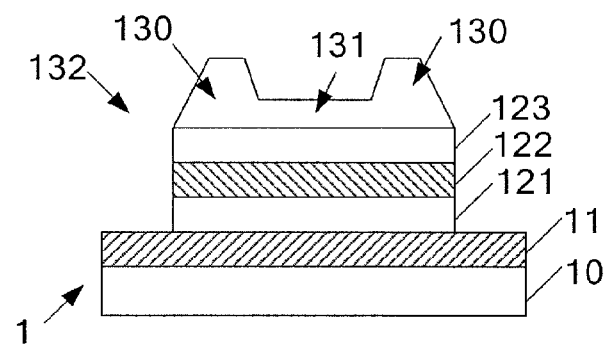
FIG. 6 is a fifth schematic structural view of fan-out lines of an array substrate in the method for manufacturing fan-out lines on the array substrate provided by an embodiment of the present technical disclosure.

S106: employing a dry etching process to etch the ohmic contact layer and the amorphous silicon layer corresponding to the photoresist-completely-removed region. For instance, as illustrated in FIG. 6, the ohmic contact layer 122 and the amorphous silicon layer 121 corresponding to the photoresist-completely-removed region 132 as illustrated in FIG. 4 are etched to remove portions of the ohmic contact layer 122 and the amorphous silicon layer 121.

Dry etching is a kind of etching process in which plasma is used for etching a film. When gas is present in the form of plasma, the gas has the following two characteristics. On one hand, as the chemical activity of the gas in the form of plasma is much stronger than that in the normal condition, a material can react rapidly by the appropriate selection of a gas or gases according to the material to be etched, and hence the objective of etching and removal can be achieved. On the other hand, the process may also utilize an electrical field to guide and accelerate the plasma so that the plasma can have certain energy; when the plasma bombards the surface of an etched object, the plasma will be stroke back by atoms of the etched object, and hence the objective of etching can be achieved by physical energy transfer.

Figure 7:
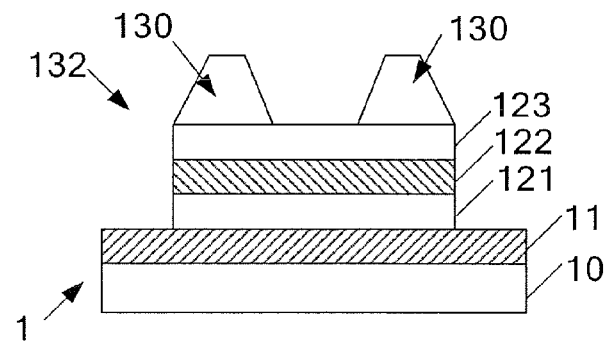
FIG. 7 is a sixth schematic structural view of fan-out lines of an array substrate in the method for manufacturing fan-out lines on the array substrate provided by an embodiment of the present technical disclosure.

S107: employing an ashing process (dry etching process) to remove the photoresist in the photoresist-partially-retained region. For instance, as illustrated in FIG. 7, the photoresist-partially-retained region 131 as illustrated in FIG. 4 is subjected to dry etching to remove the photoresist in the photoresist-partially-retained region 131; and meanwhile, the photoresist in the photoresist-completely-retained region 130 is partially removed, so that the thickness therein is reduced. As the photoresist-partially-retained region 131 is formed by a half-exposure development technology first and then the photoresist in the photoresist-partially-retained region 131 is removed by an etching process, the distance between adjacent first photoresist islands (in the photoresist-completely-retained region 130) is between 3 and 5 micrometers.

Figure 8:
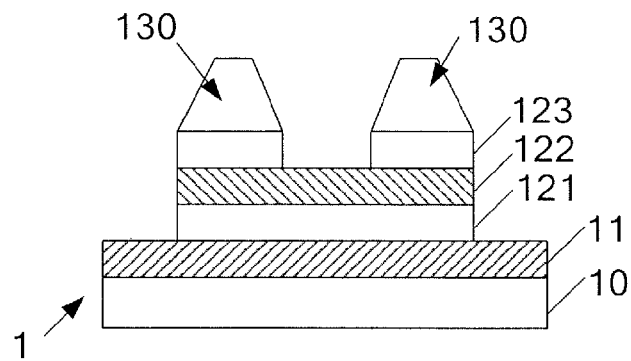
FIG. 8 is a seventh schematic structural view of fan-out lines of an array substrate in the method for manufacturing fan-out lines on the array substrate provided by an embodiment of the present technical disclosure.

S108: employing a wet or dry etching process to etch the source-drain electrode layer corresponding to the photoresist-partially-retained region. For instance, as illustrated in FIG. 8, the source-drain electrode layer 123 corresponding to the photoresist-partially-retained region 131 as illustrated in FIG. 4 is etched to remove a portion of the source-drain electrode layer 123.

S109: employing a dry etching process to etch the ohmic contact layer and the amorphous silicon layer corresponding to the photoresist-partially-retained region and retaining a part of amorphous silicon layer corresponding to the photoresist-partially-retained region.

Figure 9:
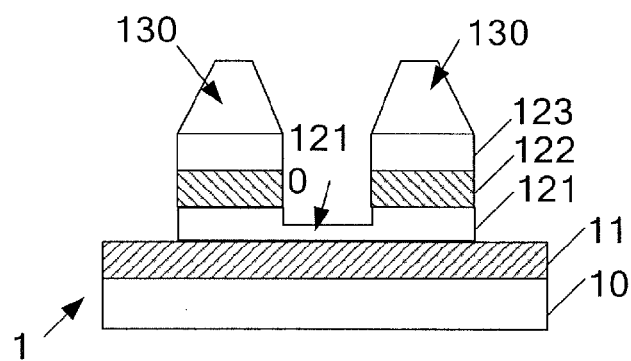
FIG. 9 is a eighth schematic structural view of fan-out lines of an array substrate in the method for manufacturing fan-out lines on the array substrate provided by an embodiment of the present technical disclosure.

For instance, as illustrated in FIG. 9, the ohmic contact layer 122 and the amorphous silicon layer 121 corresponding to the photoresist-partially-retained region 131 are etched to remove portions of the ohmic contact layer 122 and the amorphous silicon layer 121 and retain a part of amorphous silicon layer in the photoresist-partially-retained region to form an amorphous silicon partially-retained region 1210. As a part of amorphous silicon layer must be correspondingly retained in a channel area between a source area and a drain area in the process for manufacturing a TFT, so as to ensure that a source electrode and a drain electrode be connected with each other, the manufacturing method provided by the embodiment of the present technical disclosure can be compatible with the process for manufacturing the TFT of a display area.

Figure 10:
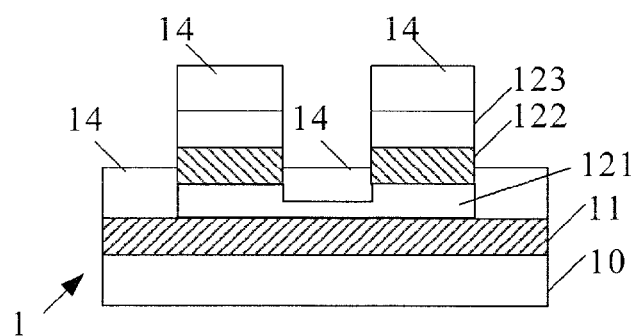
FIG. 10 is a ninth schematic structural view of fan-out lines of an array substrate in the method for manufacturing fan-out lines on the array substrate provided by an embodiment of the present technical disclosure.

S110: removing the photoresist in the photoresist-completely-retained region, and forming a second layer of photoresist on the gate insulating layer, the patterned source-drain electrode layer and the amorphous silicon layer. For instance, as illustrated in FIG. 10, the remaining photoresist in the photoresist-completely-retained region 130 in FIG. 9 is removed, and a second layer of photoresist 14 is formed on the gate insulating layer 11, the patterned source-drain electrode layer 123 and the amorphous silicon partially-retained region 1210 of the amorphous silicon layer 121.

Figure 11:
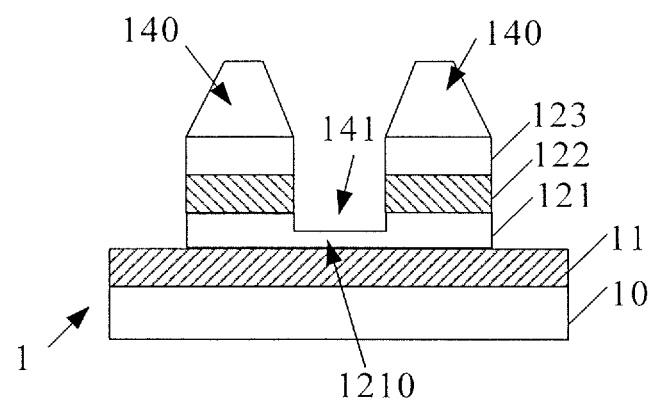
FIG. 11 is a tenth schematic structural view of fan-out lines of an array substrate in the method for manufacturing fan-out lines on the array substrate provided by an embodiment of the present technical disclosure.

S111: performing a full-exposure process on the second layer of photoresist, and forming a photoresist retained region and a photoresist non-retained region after development. For instance, as illustrated in FIG. 11, the second layer of photoresist 14 is subjected to full-exposure process with a single-tone mask, and a photoresist non-retained region 141 and a photoresist retained region 140 are formed after ashing.

S112: employing an etching process to etch the amorphous silicon layer corresponding to the photoresist non-retained region 141 so as to form a plurality of fan-out lines.

The amorphous silicon partially-retained region 1210 of the amorphous silicon layer 121 is etched away by the etching process to form a plurality of fan-out lines, and the array substrate as illustrated in FIGS. 1A and 1B is manufactured. Moreover, the distance between two adjacent fan-out lines can be reduced to be between 3 and 5 micrometers.

In the method for manufacturing fan-out lines on the array substrate provided by an embodiment of the present technical disclosure, because the first layer of photoresist is subjected to a half-exposure development process first before the process of etching the source-drain electrode layer, the ohmic contact layer and the amorphous silicon layer, and hence a tandem layer is etched by a multi-step etching technology, the distance between two adjacent fan-out lines formed by the source-drain electrode layer, the ohmic contact layer and the amorphous silicon layer can be reduced to be between 3 and 5 micrometers, and hence the resultant array substrate can meet the technical requirements of a narrow frame.

An embodiment of the present technical disclosure further provides a display device, which may be a liquid crystal display (LCD) device and comprises an opposing substrate (for instance, a color filter substrate) and the array substrate provided by the foregoing embodiment, which are arranged opposite to each other to form a liquid crystal cell, and liquid crystals filled between the color filter substrate and the array substrate.

Another embodiment of the present technical disclosure provides a display device, which may be an OLED display device and comprises the array substrate provided by the embodiment and organic light-emitting materials formed on the array substrate.

The display device provided by an embodiment of the present technical disclosure may be a display, a television, a digital picture frame, a mobile phone, a tablet PC, electronic paper or any other product or component with display function.

The embodiment of the technical disclosure being thus described, it will be obvious that the same may be varied in many ways. Such variations are not to be regarded as a departure from the spirit and scope of the technical disclosure, and all such modifications as would be obvious to those skilled in the art are intended to be included within the scope of the following claims.

What is claimed is:

1. A method for manufacturing fan-out lines on an array substrate, comprising:
    forming a gate insulating layer, an amorphous silicon layer, an ohmic contact layer and a source-drain electrode layer in a fan-out area of a base substrate in sequence;
    forming a first layer of photoresist on the source-drain electrode layer;
    performing a half-exposure process on the first layer of photoresist and forming a photoresist pattern including a photoresist-completely-retained region, a photoresist-partially-retained region, and a photoresist-completely-removed region after development, in which the photoresist-completely-retained region corresponds to the fan-out lines, and the photoresist-partially-retained region corresponds to an interval region between two adjacent fan-out lines;
    performing a combination of etching process and ashing process by: etching the source-drain electrode layer, the ohmic contact layer and the amorphous silicon layer corresponding to the photoresist-completely-removed region, removing the first layer of photoresist in the photoresist-partially-retained region by ashing, and etching and retaining a part of amorphous silicon layer in the photoresist-partially-retained region;
    removing the first layer of photoresist in the photoresist-completely-retained region, and forming a second layer of photoresist on the gate insulating layer, the patterned source-drain electrode layer layer and the amorphous silicon layer;
    performing a full-exposure process on the second layer of photoresist, and forming a second photoresist pattern including a second photoresist retained regions and a second photoresist non-retained region, in which the second photoresist retained region corresponds to fan-out lines to be formed; and
    etching the amorphous silicon layer corresponding to the second photoresist non-retained region so as to form a plurality of fan-out lines.

2. The method for manufacturing fan-out lines on the array substrate according to claim 1, wherein the combination of etching process and ashing process comprises:
    employing a wet etching process to etch the source-drain electrode layer corresponding to the photoresist-completely-removed region;

employing a dry etching process to etch the ohmic contact layer and the amorphous silicon layer corresponding to the photoresist-completely-removed region;

employing an ashing process to remove the first layer of photoresist in the photoresist-partially-retained region;

employing a wet or dry etching process to etch the source-drain electrode layer corresponding to the photoresist-partially-retained region; and employing a dry etching process to etch the ohmic contact layer and the amorphous silicon layer corresponding to the photoresist-partially-retained region and retaining a part of amorphous silicon layer.

3. The method for manufacturing fan-out lines on the array substrate according to claim 1, wherein a distance between adjacent fan-out lines is between 3 and 5 micrometers.

4. The method for manufacturing fan-out lines on the array substrate according to claim 2, wherein a distance between adjacent fan-out lines is between 3 and 5 micrometers.

5. The method for manufacturing fan-out lines on the array substrate according to claim 1, wherein the base substrate is made of alkali-free glass.

* * * * *